(12) United States Patent
Xie et al.

(10) Patent No.: US 11,139,242 B2
(45) Date of Patent: Oct. 5, 2021

(54) VIA-TO-METAL TIP CONNECTIONS IN MULTI-LAYER CHIPS

(71) Applicant: INTERNATIONAL BUSINESS MACHINES CORPORATION, Armonk, NY (US)

(72) Inventors: Ruilong Xie, Niskayuna, NY (US); Chih-Chao Yang, Glenmont, NY (US); Chi-Chun Liu, Altamont, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 28 days.

(21) Appl. No.: 16/397,250

(22) Filed: Apr. 29, 2019

(65) Prior Publication Data
US 2020/0343186 A1 Oct. 29, 2020

(51) Int. Cl.
*H01L 23/528* (2006.01)
*H01L 23/522* (2006.01)
(Continued)

(52) U.S. Cl.
CPC ...... *H01L 23/5283* (2013.01); *H01L 21/0217* (2013.01); *H01L 21/0228* (2013.01); *H01L 21/02164* (2013.01); *H01L 21/02178* (2013.01); *H01L 21/02271* (2013.01); *H01L 21/31053* (2013.01); *H01L 21/31116* (2013.01);
(Continued)

(58) Field of Classification Search
CPC ......... H01L 21/76804; H01L 21/76816; H01L 23/5226; H01L 23/5283; H01L 21/768–76898; H01L 23/522–53295; H01L 23/53295; H01L 21/76829–76835; H01L 21/76835; H01L 21/76802–76817;
(Continued)

(56) References Cited

U.S. PATENT DOCUMENTS

| 4,818,162 A | 4/1989 | Zukowski et al. |
| 5,286,674 A * | 2/1994 | Roth ................. H01L 21/76802 438/624 |

(Continued)

FOREIGN PATENT DOCUMENTS

CN 106903214 6/2017

OTHER PUBLICATIONS

Bo Cui et al., "Filling of nano-via holes by laser-assisted direct imprint", Microelectronic Engineering 83 (Feb. 2006) 1547-1550.
(Continued)

*Primary Examiner* — Kevin Parendo
(74) *Attorney, Agent, or Firm* — Tutunjian & Bitetto, P.C.; L. Jeffrey Kelly

(57) ABSTRACT

Integrated chips and methods for forming vias in the same include forming a multi-layer isolation structure on an underlying layer. The multi-layer isolation structure includes a first isolation layer around a second isolation layer. Conductive material is formed around the multi-layer isolation structure. The first isolation layer is etched back to expose at least a portion of a sidewall of the conductive material. A conductive via is formed to contact a top surface and the exposed portion of the sidewall of the conductive material.

14 Claims, 7 Drawing Sheets

(51) Int. Cl.
*H01L 21/02* (2006.01)
*H01L 21/3105* (2006.01)
*H01L 21/768* (2006.01)
*H01L 21/311* (2006.01)

(52) U.S. Cl.
CPC .. *H01L 21/31144* (2013.01); *H01L 21/76804* (2013.01); *H01L 21/76816* (2013.01); *H01L 21/76834* (2013.01); *H01L 21/76877* (2013.01); *H01L 23/5226* (2013.01)

(58) Field of Classification Search
CPC ....... H01L 21/76805; H01L 21/76877–76883; H01L 21/311–31144
See application file for complete search history.

(56) References Cited

U.S. PATENT DOCUMENTS

| | | | |
|---|---|---|---|
| 5,463,274 | A | 10/1995 | Winsor |
| 7,807,567 | B2 | 10/2010 | Kawano et al. |
| 8,298,943 | B1 | 10/2012 | Arnold et al. |
| 9,960,110 | B2 | 5/2018 | Boyanov |
| 2008/0132059 | A1* | 6/2008 | Noguchi ............. H01L 21/0217 438/643 |
| 2009/0166881 | A1* | 7/2009 | Balakrishnan .... H01L 23/53295 257/774 |
| 2011/0177670 | A1* | 7/2011 | Herrin ..................... G03F 9/708 438/401 |
| 2013/0214391 | A1* | 8/2013 | Choi ..................... H01L 23/296 257/622 |
| 2014/0264894 | A1 | 9/2014 | Tien et al. |
| 2016/0056104 | A1 | 2/2016 | Bouche et al. |
| 2016/0111430 | A1* | 4/2016 | Liaw ................... H01L 27/1104 257/384 |
| 2016/0204002 | A1 | 7/2016 | Wallace et al. |
| 2017/0179021 | A1* | 6/2017 | Cheng .............. H01L 21/76843 |
| 2017/0186682 | A1* | 6/2017 | Anderson ......... H01L 21/31053 |
| 2018/0033692 | A1 | 2/2018 | Wallace et al. |
| 2018/0269305 | A1 | 9/2018 | Bao et al. |

OTHER PUBLICATIONS

K.-W Lee et al., "Highly Manufacturable Cu/Low-k Dual Damascene Process Integration for 65nm Technology Node", Proceedings of the IEEE 2004 International Interconnect Technology Conference, Burlingame, CA, USA, Jun. 2004, pp. 57-59.

* cited by examiner

VIA-TO-METAL TIP CONNECTIONS IN MULTI-LAYER CHIPS

BACKGROUND

The present invention generally relates to integrated circuit fabrication and, more particularly, to the reinforcement of the connection between vias and metal lines in multi-layer chips.

In existing multi-layer chip designs, where an interconnect layer sits on top of a device layer and makes electrical connections to the devices in the device layer by one or more vias, the pitch of the interconnect layer can be substantially smaller than the pitch of the device layer. For example, if the device layer is formed using standard lithographic techniques, and the interconnect layer is formed using sidewall image transfer techniques that reduce the size of the vias below that of the contacts in the underlying device layer, weak connections can result between the device layer contacts and the vias.

SUMMARY

A method of forming a via includes forming a multi-layer isolation structure on an underlying layer. The multi-layer isolation structure includes a first isolation layer around a second isolation layer. Conductive material is formed around the multi-layer isolation structure. The first isolation layer is etched back to expose at least a portion of a sidewall of the conductive material. A conductive via is formed to contact a top surface and the exposed portion of the sidewall of the conductive material.

A method of forming vias includes forming multi-layer isolation structures on an underlying layer. The multi-layer isolation structures each include a first isolation layer around a second isolation layer. Conductive material is formed around and between the multi-layer isolation structures. Conductive material between the multi-layer isolation structures has a trapezoidal cross-section and conductive material in other regions has a parallelogram cross-section. The first isolation layer is etched back to expose at least a portion of a sidewall of the conductive material. A conductive via is formed to contact a top surface and the exposed portion of the sidewall of the conductive material.

An integrated chip includes a device layer, a contact layer, and a via layer. The contact layer is formed on the device layer and includes conductive contacts separated by multi-layer isolation structures. The via layer includes one or more conductive vertical vias that penetrate a dielectric layer that covers the contact layer to make contact with the conductive contacts. A contact surface of each conductive vertical via contacts a top surface and a side surface of each respective conductive contact.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention improve the connections between interconnect layer vias and underlying device layer contacts. The present embodiments use a bilayer isolation region between adjacent contacts. Before forming a via down to the contacts, the present embodiments partially etch one of the layers in the bilayer isolation region, thereby increasing the area available for electrical contact to the contacts. The other layer is left intact, guaranteeing sufficient electrical isolation between adjacent contacts. The resulting connection between the via and the contact is significantly stronger, as the via contacts not only the top surface of the contact, but also at least a portion of a sidewall of the contact.

Figure 1:
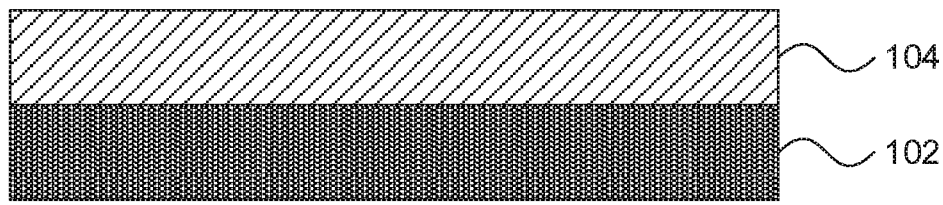
FIG. 1 is a cross-sectional diagram of a step in the formation of an integrated multi-layer chip that has interlayer vias with secure connections to underlying contacts, showing an interlayer dielectric being formed on an underlying device layer in accordance with an embodiment of the present invention.

Referring now to the drawings in which like numerals represent the same or similar elements and initially to FIG. 1, a cross-sectional view of a step in the formation of interconnects in a multi-layer integrated circuit is shown. One or more underlying layers are represented as underlying layer 102, which may include, for example, device layers, interconnect layers, substrate layers, etc. It is specifically contemplated that such device layers may include semiconductor devices such as transistors and electrical devices such as capacitors, transmission lines, inductors, and resistors. Any appropriate arrangement of such layers, and such devices within such layers, can be used. In some particularly contemplated embodiments, at least one conductive contact will be present on a top surface of the underlying layer 102, to form an electrical connection with overlying layers.

A layer of dielectric material 104 is formed on the underlying layer 102. It is specifically contemplated that the dielectric material 104 can include any appropriate insulator including silicon dioxide or any appropriate low-k or high-k dielectric material. As used herein, the terms "low-k" and "high-k" refer to materials having a dielectric constant k that is lower or higher than that of silicon dioxide. The layer of conductive material can further include layers that are used for patterning, for example dielectric/hardmask layers, which are not shown as distinct layers herein.

Figure 2:
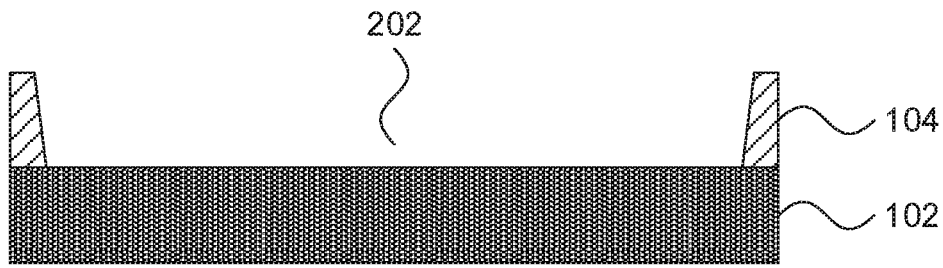
FIG. 2 is a cross-sectional diagram of a step in the formation of an integrated multi-layer chip that has interlayer vias with secure connections to underlying contacts, showing a trench being formed in the interlayer dielectric in accordance with an embodiment of the present invention.

Referring now to FIG. 2, a cross-sectional view of a step in the formation of interconnects in a multi-layer integrated circuit is shown. A trench 202 is formed in the dielectric layer 104. The trench 202 can be formed by any appropriate etching process. It is specifically contemplated that an anisotropic etch, such as reactive ion etching (RIE), may be used to form the trench 202.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
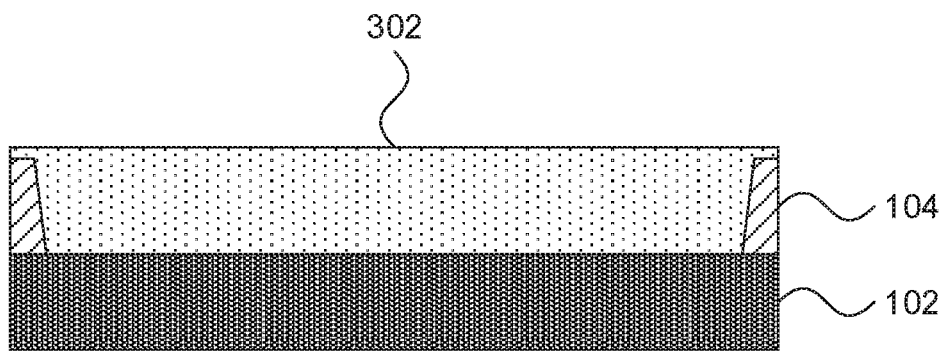
FIG. 3 is a cross-sectional diagram of a step in the formation of an integrated multi-layer chip that has interlayer vias with secure connections to underlying contacts, showing the trench being filled with an organic planarizing layer (OPL) in accordance with an embodiment of the present invention.

Referring now to FIG. 3, a cross-sectional view of a step in the formation of interconnects in a multi-layer integrated circuit is shown. An organic planarizing layer (OPL) 302 can be spin-coated to fill the trench 202 and can then be etched back. A portion of the OPL 302 is left above the dielectric layer 104 to prevent damage to the underlying stack.

The OPL 302 can include a photo-sensitive organic polymer that, when exposed to electromagnetic (EM) radiation, changes chemically to be removable by a developing solvent. Examples of photo-sensitive organic polymers may include polyacrylate resin, epoxy resin, phenol resin, polyamide resin, polyimide resin, unsaturated polyester resin, polyphenylenether resin, polyphenylenesulfide resin, or benzocyclobutene. More generally, the OPL 302 may be formed from any organic polymer having a molecular structure that can attach to the molecular structure of the organic polymer. The developable OPL 302 may, for example, be applied using spin coating technology.

Figure 4:
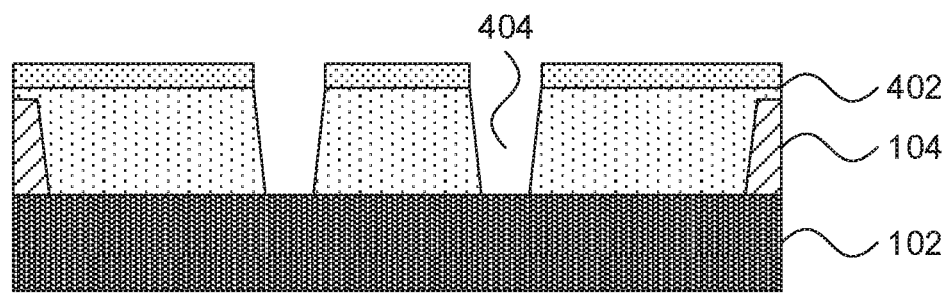
FIG. 4 is a cross-sectional diagram of a step in the formation of an integrated multi-layer chip that has interlayer vias with secure connections to underlying contacts, showing isolation trenches being formed in the OPL in accordance with an embodiment of the present invention.

Referring now to FIG. 4, a cross-sectional view of a step in the formation of interconnects in a multi-layer integrated circuit is shown. An anti-reflection coating 402 can be deposited on the OPL 302 using, e.g., a titanium oxide layer or any other appropriate anti-reflective material. The anti-reflection coating 402 can be deposited using any appropriate deposition technique, including chemical vapor deposition (CVD), atomic layer deposition (ALD), physical vapor deposition (PVD), or gas cluster ion beam (GCIB) deposition.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Photo-resist is then coated over the ARC layer 402 (not shown), followed by lithography exposure to define the pattern. The ARC layer 402 and OPL layer 302 is then etched using an anisotropic etch to form trenches 404, during the etch, the photo-resist layer above 402 is also gone. A selective etch is used that does not harm the underlying layer 102. The width of the vias should be large enough to accommodate a minimum dimension for electrical isolation, plus an additional width to accommodate a connection reinforcing thickness. It should be noted that the fabrication process used for patterning the OPL 302 can have a minimum feature size. For example, photolithography processes have a minimum feature size and minimum pitch between structures that result from the physical limitations of the process. As used herein, the term "selective" in reference to a material removal process denotes that the rate of material removal for a first material is greater than the rate of removal for at least another material of the structure to which the material removal process is being applied.

Figure 5:
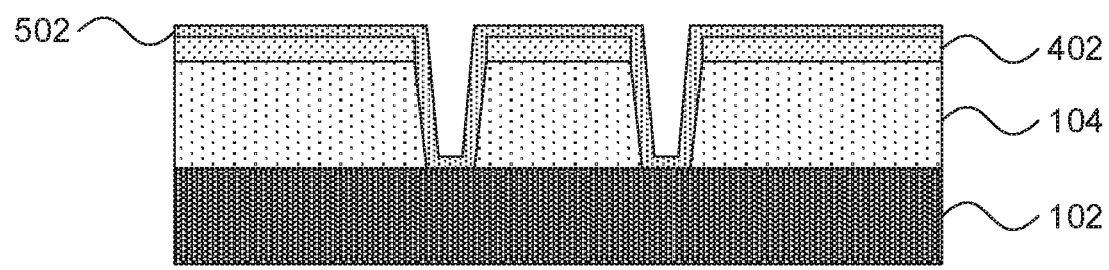
FIG. 5 is a cross-sectional diagram of a step in the formation of an integrated multi-layer chip that has interlayer vias with secure connections to underlying contacts, showing a first dielectric layer being formed in the isolation trenches in accordance with an embodiment of the present invention.

Referring now to FIG. 5, a cross-sectional view of a step in the formation of interconnects in a multi-layer integrated circuit is shown. A first isolation layer 502 is conformally deposited over the anti-reflection coating 402 and in the trenches 402 using and appropriate deposition process such as, e.g., CVD or ALD. It is specifically contemplated that the first isolation layer 502 can be formed from silicon nitride using a plasma-enhanced ALD process to a thickness of about 5 nm, but it should be understood that any appropriate electrically insulating material, deposition process, and thickness can be used instead.

Figure 6:
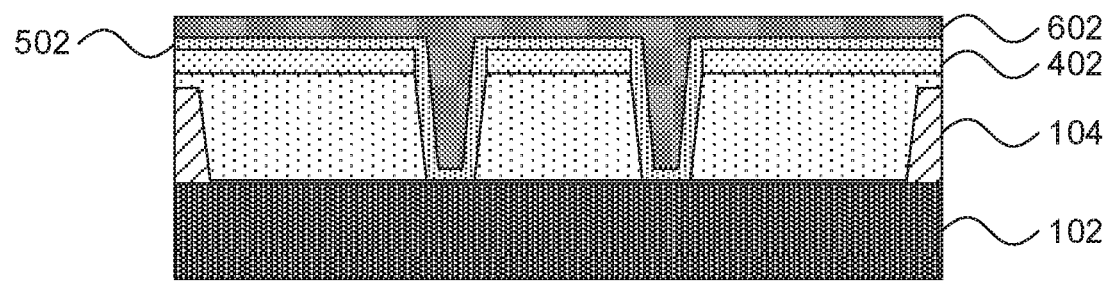
FIG. 6 is a cross-sectional diagram of a step in the formation of an integrated multi-layer chip that has interlayer vias with secure connections to underlying contacts, showing a second dielectric layer filling the isolation trenches in accordance with an embodiment of the present invention.

Referring now to FIG. 6, a cross-sectional view of a step in the formation of interconnects in a multi-layer integrated circuit is shown. A second isolation layer 602 is conformally deposited over the first isolation layer 602. The width of the second isolation layer 602 in the trenches 404 is at least large enough to provide electrical isolation between the regions to the left and right on its own, even if the first isolation layer 502 were absent. In some embodiments, this thickness can be at least 8 nm. The second isolation layer 602 can be formed from any appropriate electrically insulating material, such as an aluminum oxide, and can be deposited using any appropriate deposition process, such as CVD, ALD, PVD, or GCIB deposition. It should be noted that the material used for the first isolation layer 502 should be selectively etchable with respect to the material of the material of the second isolation layer 602. Further, the thickness of the deposited second isolation layer 602 should be greater than one half the width of the trenches 404 to ensure that the trenches are completely filled.

Figure 7:
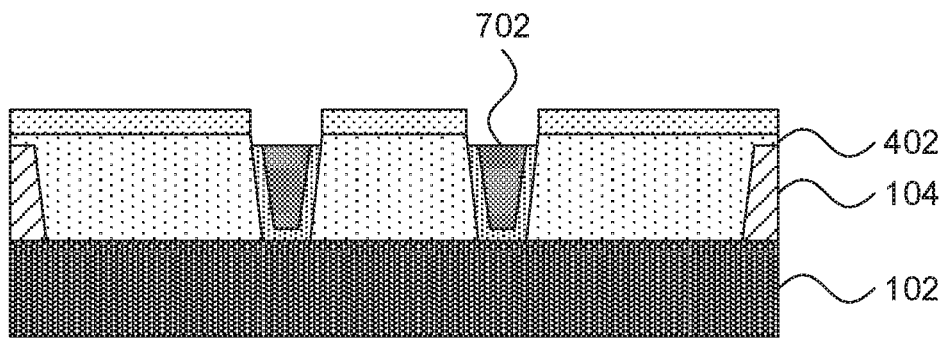
FIG. 7 is a cross-sectional diagram of a step in the formation of an integrated multi-layer chip that has interlayer vias with secure connections to underlying contacts, showing the first and second dielectric layers being etched back to separate out multi-layer isolation structures in accordance with an embodiment of the present invention.

Referring now to FIG. 7, a cross-sectional view of a step in the formation of interconnects in a multi-layer integrated circuit is shown. The first isolation layer 502 and the second isolation layer 602 are etched back to remove material from the isolation layers on horizontal surfaces. This separates the multi-layer isolation structures 702 from one another. In some embodiments the isolation layers can be polished back using a chemical mechanical planarization (CMP) process that stops on the anti-reflection coating 402. In another embodiment, the multi-layer isolation structures 702 can be formed by etching the second isolation layer 602 and the first isolation layer 502 in one or more isotropic or anisotropic etches that selectively remove the material of the isolation layers without damaging the material of the anti-reflection coating 402.

CMP is performed using, e.g., a chemical or granular slurry and mechanical force to gradually remove upper layers of the device. The slurry may be formulated to be unable to dissolve, for example, the anti-reflection coating 402, resulting in the CMP process's inability to proceed any farther than that layer.

Figure 8:
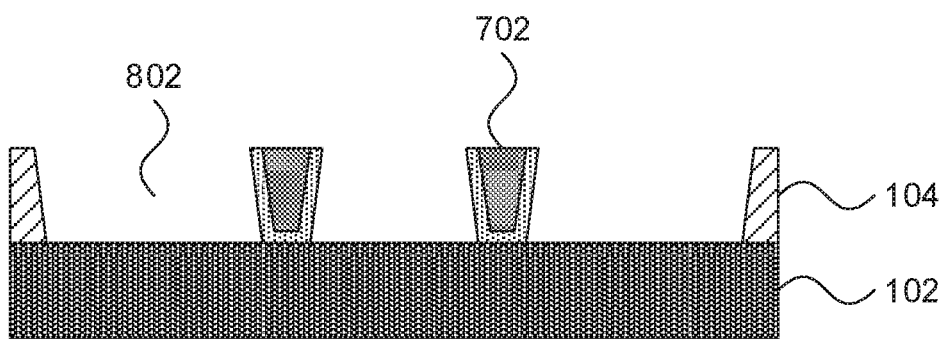
FIG. 8 is a cross-sectional diagram of a step in the formation of an integrated multi-layer chip that has interlayer vias with secure connections to underlying contacts, showing the removal of the OPL to expose spaces between and around the multi-layer isolation trenches in accordance with an embodiment of the present invention.

Referring now to FIG. 8, a cross-sectional view of a step in the formation of interconnects in a multi-layer integrated circuit is shown. The remaining anti-reflection coating 402 and OPL 302 material is etched away using any appropriate etch, leaving the multi-layer isolation structures 702 behind, separating gaps 802.

Figure 9:
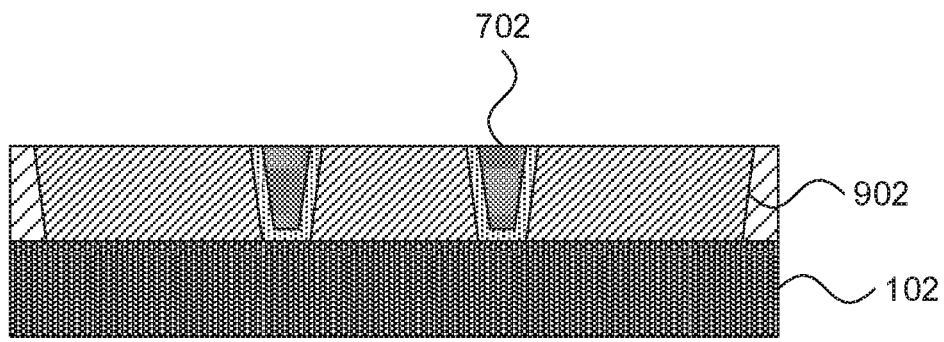
FIG. 9 is a cross-sectional diagram of a step in the formation of an integrated multi-layer chip that has interlayer vias with secure connections to underlying contacts, showing the formation of conductive contacts in the regions between and around the multi-layer isolation trenches in accordance with an embodiment of the present invention.

Referring now to FIG. 9, a cross-sectional view of a step in the formation of interconnects in a multi-layer integrated circuit is shown. The gaps 802 are filled in with a conductive material to form metal lines 902, separated from one another by the multi-layer isolation structures 702. The conductive material can be deposited by any appropriate process, including CVD, ALD, PVD, electroplating, or GCIB deposition for example, and can be formed from any appropriate conductive material, whether the same material as described above for layer 104 or a different conductive material. The deposited conductive material is polished down to the level of the top surface of the multi-layer isolation structures 702 using, e.g., a CMP process.

The structure that results from the present embodiments in the conductive lines 902 is determined by whether one or both edges are defined by a metal cut process. In particular, the initial photolithographic etch that defines the dielectric layer 202 produces a downward slope that matches the slope formed by etching the trenches 404. Thus, conductive lines 902 that are between these two slopes will have a parallelogram cross section. Conductive lines 902 that are between two trenches, however, will have slopes in opposite directions, producing a trapezoidal cross-section.

Figure 10:
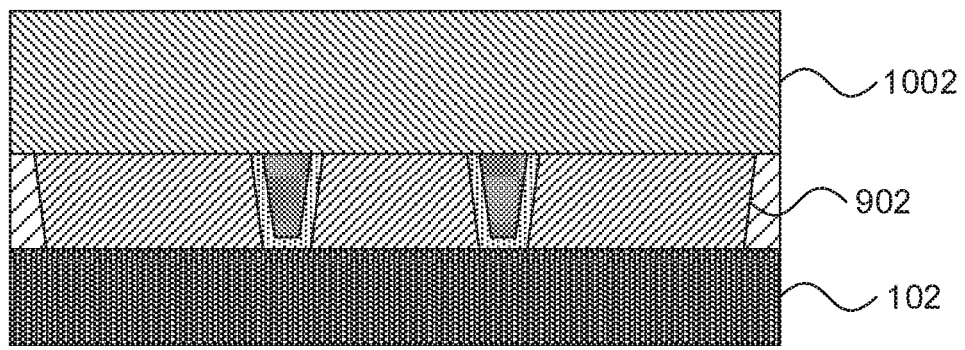
FIG. 10 is a cross-sectional diagram of a step in the formation of an integrated multi-layer chip that has interlayer vias with secure connections to underlying contacts, showing the formation of a dielectric layer over the conductive contacts in accordance with an embodiment of the present invention.

Referring now to FIG. 10, a cross-sectional view of a step in the formation of interconnects in a multi-layer integrated circuit is shown. A layer of dielectric material 1002 is formed over the conductive lines 902 and multi-layer isolation structures 702. Any appropriate dielectric material, such as silicon dioxide, low-k dielectric, etc. can be used for the layer 1002 and can be deposited using any appropriate process, including CVD, ALD, PVD, or GCIB deposition, for example.

Figure 11:
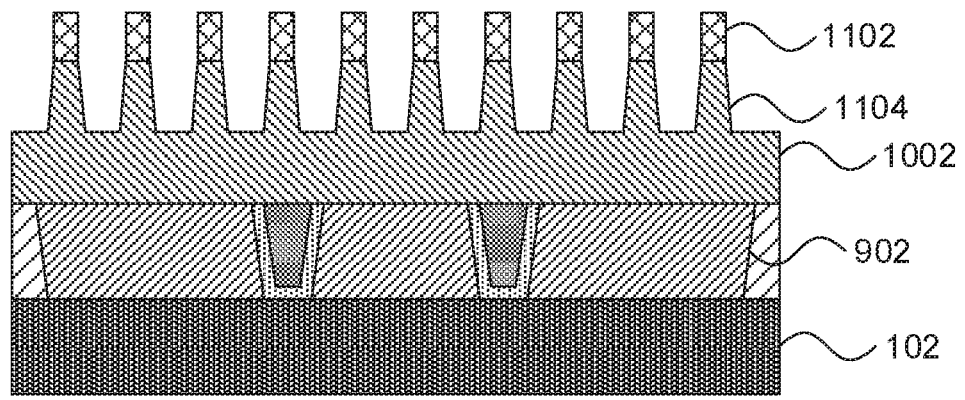
FIG. 11 is a cross-sectional diagram of a step in the formation of an integrated multi-layer chip that has interlayer vias with secure connections to underlying contacts, showing the masking and etching of the dielectric layer in accordance with an embodiment of the present invention.

Referring now to FIG. 11, a cross-sectional view of a step in the formation of interconnects in a multi-layer integrated circuit is shown. A pattern is formed using hardmasks 1102, which can be formed from any appropriate dielectric material with etch selectivity relative to the dielectric layer 1002, such as silicon nitride, titanium nitride, hafnium dioxide, etc. The hardmasks 1102 can be formed using any appropriate process, such as sidewall image transfer, to form structures 1104 with a smaller width than the width of the multi-layer isolation structures 702. In other words, the fabrication process for the hardmasks 1102 can produce structures that have a feature size that is smaller than the minimum feature size of the fabrication process used to form the multi-layer isolation structures 702.

The hardmasks 1102 are then used as masks for etching the dielectric layer 1002. The dielectric layer 1002 is etched partially, leaving some to cover the multi-layer isolation structures 702 and the conductive lines 902. This is to define the metal line trenches. This etch can be performed using any appropriate anisotropic etch, such as RIE, that is timed to prevent etching through.

Figure 12:
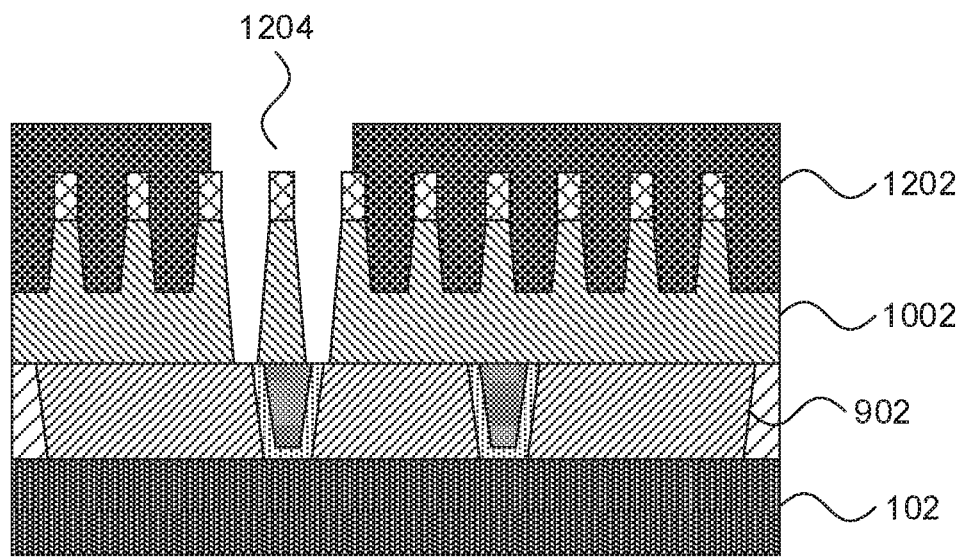
FIG. 12 is a cross-sectional diagram of a step in the formation of an integrated multi-layer chip that has interlayer vias with secure connections to underlying contacts, showing further masking of the dielectric layer to establish a via location in accordance with an embodiment of the present invention.

Referring now to FIG. 12, a cross-sectional view of a step in the formation of interconnects in a multi-layer integrated circuit is shown. A second mask 1202 is formed over the hardmasks 1102, leaving a gap 1204 exposed. An anisotropic etch is applied to further etch down the dielectric layer 1002, down to the level of the conductive lines 902, to define the vias that are self-aligned to the conductive line trenches.

Figure 13:
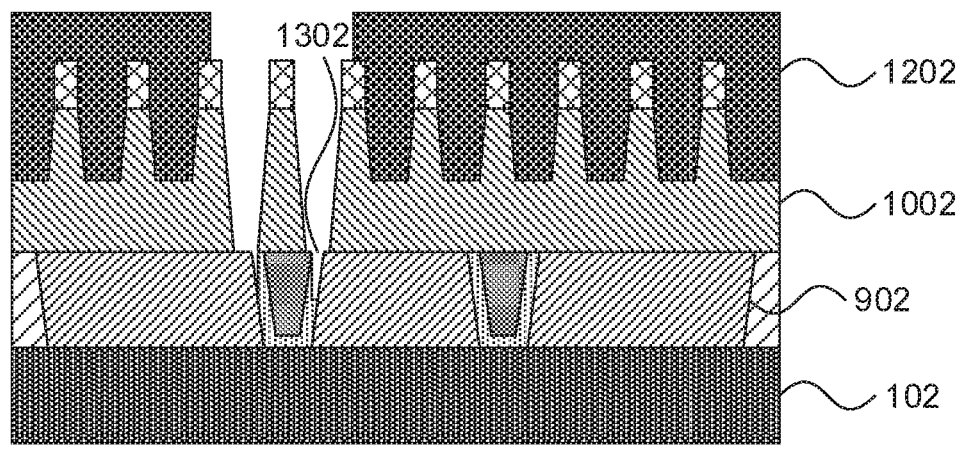
FIG. 13 is a cross-sectional diagram of a step in the formation of an integrated multi-layer chip that has inter-layer vias with secure connections to underlying contacts, showing etching back exposed portions of the dielectric layer to expose the underlying conductive contacts and further to etch back part of the multi-layer isolation structures in accordance with an embodiment of the present invention.

Referring now to FIG. 13, a cross-sectional view of a step in the formation of interconnects in a multi-layer integrated circuit is shown. A further anisotropic etch is used to etch back any exposed portions of the first isolation layer 502 in the multi-layer isolation structures 702. This etch is selective to the material of the first isolation layer 502 and does not damage the second isolation layer 602 or the structures 1104 dielectric layer 1002. The etch forms gaps 1302 at the sides of the partially exposed multi-layer isolation structures 702. The selectivity of the etch ensures that the multi-layer isolation structures 702 will always have at least a minimum dielectric trench width.

The present embodiments show two potential scenarios for how the etch affects the underlying layers. In a first scenario, part of the via overlaps both the sidewall dielectric layer 502 and the center dielectric 602. In this scenario, the sidewall dielectric layer 502 is deeply etched, leaving the center dielectric 602 unetched. In a second scenario, the via only overlaps the sidewall dielectric layer 502. In this scenario, the depth of the etch may not be as deep due to the edge loading effect.

Figure 14:
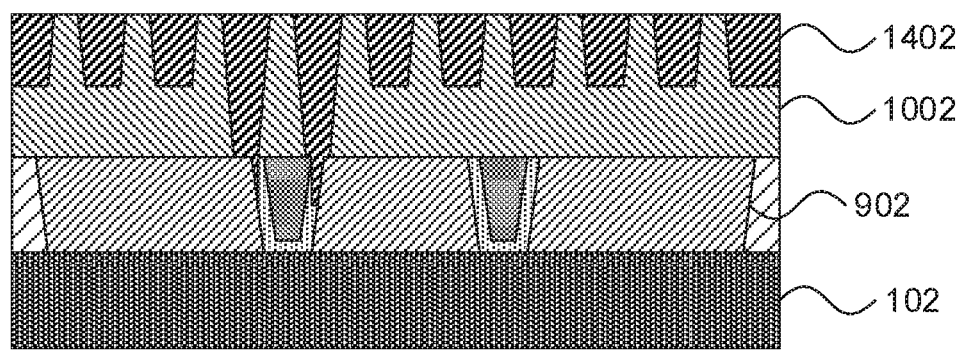
FIG. 14 is a cross-sectional diagram of a step in the formation of an integrated multi-layer chip that has inter-layer vias with secure connections to underlying contacts, showing the formation of conductive material to form vias in contact with top and side surfaces of the conductive contacts in accordance with an embodiment of the present invention.

Referring now to FIG. 14, a cross-sectional view of a step in the formation of interconnects in a multi-layer integrated circuit is shown. A metal layer 1402 is deposited by any appropriate deposition process and is then polished down to the level of the hardmasks 1102 using, e.g., a CMP process that stops on layer 1002. The metal layers fill in the spaces between the hardmasks 1101 and, in the areas that were exposed to the selective etch in FIG. 13, the metal layers fill in the gaps 1302 to form a connection along sidewalls of the underlying conductive lines 902. This sidewall connection improves the strength of the electrical connection between the deposited vias and the contacts.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "an" "the" are intended to include the plural fogs as well, unless the context clearly indicates otherwise. It will be further understood that the terms "comprises," "comprising," "includes" and/or "inducting," when used herein, specify the presence of stated features, integers, steps, operations, elements and/or components, but do not preclude the presence or addition of one or more other features, integers, steps, operations, elements, components cl ups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms ended to encompassorientations of the device in use or operation addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orietations), and the spatially relative descriptors used herein can be interpreted accordingly. In addition, it will also be understood that when a layer referred to as being "between" two layers, it can be the only layer between the two layers intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 15:
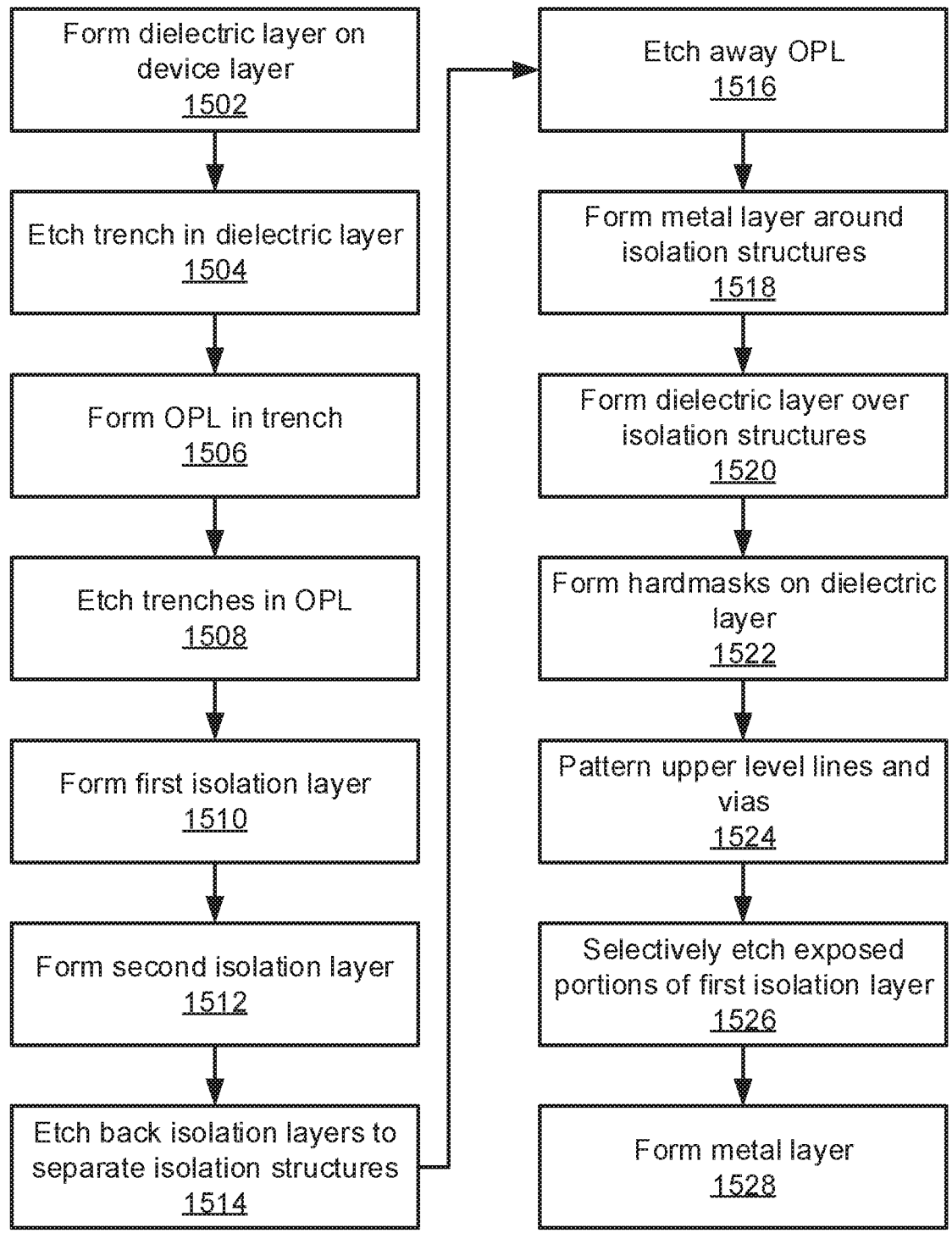
FIG. 15 is a block/flow diagram of a fabrication process to form an integrated multi-layer chip that has inter-layer vias with secure connections to underlying contacts in accordance with an embodiment of the present invention.

Referring now to FIG. 15, a method for forming interconnects in a multi-layer integrated circuit is shown. Block 1502 forms a dielectric layer 104 on top of an underlying layer 102. Block 1504 then forms a trench 202 in the dielectric layer 104 using any appropriate selective, anisotropic etch. Block 1506 deposits an OPL 304 in the trench 202 and then block 1508 etches trenches 404 in the OPL 302 using a mask 402 and an appropriate anisotropic etch.

Block 1510 forms a first isolation layer 502 in the trenches 404 and block 1512 forms a second isolation layer 604 to fill the remainder of the trenches 404. The isolation layers are formed by any appropriate conformal deposition process, such as CVD or ALD. Block 1514 then etches back isolation layers 502 and 602 to separate out the multi-layer isolation structures 702.

Block 1516 etches away the remaining OPL 302 to form gaps 802. Block 1518 fills in a contact layer 902 around the multi-layer isolation structures 702 using any appropriate deposition process. Block 1520 then forms dielectric layer 1002 over the isolation structures 702.

Block 1522 forms hardmask structures 1102 on the dielectric layer 1002 using a fabrication process that produces structures having a smaller dimension than can be formed using photolithography, such as sidewall image transfer. Block 1524 uses the hardmasks 1102 to etch a pattern into the dielectric layer 1002 using a timed selective anisotropic etch and then fully etches back the dielectric layer 1002 down to the conductive lines 902 by forming a mask 1202 over some of the hardmasks 1102. This forms a pattern for the subsequent deposition of conductive material. Block 1526 then etches away exposed portions of the first isolation layer 502, exposing at least a portion of the sidewalls of the conductive lines 902. Block 1528 forms a conductor layer 1402 into the gaps 1302 to form vias that connect to the conductive lines 902.

Having described preferred embodiments of improved via-to-metal chip connections in multi-layer chips (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a via, comprising:
   etching a trench using a first photolithographic fabrication process with a minimum feature size;
   forming a multi-layer isolation structure on an underlying layer, in the trench, the multi-layer isolation structure including a first isolation layer around a second isolation layer and having sloped sidewalls;
   forming conductive material around the multi-layer isolation structure after forming the multi-layer isolation structure;
   etching back the first isolation layer to expose at least a portion of a sidewall of the conductive material; and
   forming a conductive via to contact a top surface and the exposed portion of the sidewall of the conductive material.

2. The method of claim 1, wherein the second isolation layer has a thickness sufficient to electrically isolate the conducive material on respective sides of the multi-layer isolation structure.

3. The method of claim 1, wherein the first isolation layer is formed from a first dielectric material and the second isolation layer is formed from a second dielectric material that is selectively etchable with respect to the first dielectric material.

4. The method of claim 1, furthering comprising forming a hardmask structure using a second fabrication process, wherein the hardmask structure has a dimension that is smaller than the minimum feature size of the first photolithographic fabrication process.

5. The method of claim 4, wherein the hardmask is positioned at least partially above the multi-layer isolation structure.

6. The method of claim 1, wherein the first isolation layer has a thickness of at least 8 nm.

7. The method of claim 1, wherein forming the multi-layer isolation structure comprises forming a plurality of such multi-layer isolation structures, with at least one region between the multi-layer isolation structures.

8. The method of claim 7, wherein forming the conductive material around the multi-layer isolation structures comprises forming a first conductive material with a cross-section with non-parallel sidewalls in at least one region between the multi-layer isolation structures and forming a second conductive material with a parallelogram cross-section in other regions.

9. A method of forming vias, comprising:
   etching trenches using a first photolithographic fabrication process with a minimum feature size;
   forming a plurality of multi-layer isolation structures on an underlying layer, in the trenches, each including a first isolation layer around a second isolation layer and having sloped sidewalls;
   forming conductive material around and between the multi-layer isolation structures, after forming the plurality of multi-layer isolation structures, with conductive material between the multi-layer isolation structures having a cross-section with non-parallel sidewalls and conductive material in other regions having a parallelogram cross-section;
   etching back the first isolation layer to expose at least a portion of a sidewall of the conductive material; and
   forming a conductive via to contact a top surface and the exposed portion of the sidewall of the conductive material.

10. The method of claim 9, wherein the second isolation layer has a thickness sufficient to electrically isolate the conducive material on respective sides of the multi-layer isolation structure.

11. The method of claim 9, wherein the first isolation layer is formed from a first dielectric material and the second isolation layer is formed from a second dielectric material that is selectively etchable with respect to the first dielectric material.

12. The method of claim 9, furthering comprising forming a hardmask structure using a second fabrication process, wherein the hardmask structure has a dimension that is smaller than the minimum feature size of the first photolithographic fabrication process.

13. The method of claim 12, wherein the hardmask is positioned at least partially above the multi-layer isolation structure.

14. The method of claim 9, wherein the first isolation layer has a thickness of at least 8 nm.

\* \* \* \* \*